(12) United States Patent
Wu et al.

(10) Patent No.: US 7,442,962 B2
(45) Date of Patent: *Oct. 28, 2008

(54) HIGH-BRIGHTNESS GALLIUM-NITRIDE BASED LIGHT EMITTING DIODE STRUCTURE

(75) Inventors: Liang-Wen Wu, Banciao (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 320 days.

This patent is subject to a terminal disclaimer.

(21) Appl. No.: 11/266,462

(22) Filed: Nov. 3, 2005

(65) Prior Publication Data

US 2006/0102921 A1    May 18, 2006

Related U.S. Application Data

(63) Continuation-in-part of application No. 10/987,518, filed on Nov. 12, 2004, now Pat. No. 7,180,097.

(51) Int. Cl.
*H01L 27/15* (2006.01)
*H01L 31/12* (2006.01)

(52) U.S. Cl. .................... 257/79; 257/103

(58) Field of Classification Search ............ 257/79, 257/85, 103, 189, 194
See application file for complete search history.

(56) References Cited

U.S. PATENT DOCUMENTS 7,180,097 B2 *  2/2007  Wu et al. ............ 257/79

FOREIGN PATENT DOCUMENTS

KR    10-2004-53392    *  7/2004

* cited by examiner

*Primary Examiner*—Theresa T Doan

(57) ABSTRACT

A GaN-based LED structure is provided so that the brightness and lighting efficiency of the GaN-based LED are enhanced effectively. The greatest difference between the GaN-based LEDs according to the invention and the prior arts lies in the addition of a thin layer on top of the traditional structure. The thin layer could be formed using silicon-nitride (SiN), or it could have a superlattice structure either made of layers of SiN and undoped indium-gallium-nitride (InGaN), or made of layers SiN and undoped aluminum-gallium-indium-nitride (AlGaInN), respectively. Because of the use of SiN in the thin layer, the surfaces of the GaN-based LEDs would be micro-roughened, and the total internal reflection resulted from the GaN-based LEDs' higher index of refraction than the atmosphere could be avoided.

24 Claims, 4 Drawing Sheets

HIGH-BRIGHTNESS GALLIUM-NITRIDE BASED LIGHT EMITTING DIODE STRUCTURE

CROSS-REFERENCE TO RELATED APPLICATIONS

This is a continuation-in-part of U.S. application Ser. No. 10/987,518, filed on Nov. 12, 2004, now U.S. Pat. No. 7,180,097, issued on Feb. 20, 2007.

BACKGROUND OF THE INVENTION

1. Field of the Invention

The present invention generally relates to gallium-nitride based light emitting diodes and, more particularly, to the high-brightness gallium-nitride based light emitting diodes having a micro-roughened surface.

2. The Prior Arts

Gallium-nitride (GaN) based light-emitting diodes (LEDs), as various colored LEDs can be developed by controlling the GaN-based material's composition, have been the research and development focus in the academic arena and in the industries as well in recent years. One of the research directions regarding GaN-based LEDs lies in the further understanding of the light emitting characteristics of GaN-based LEDs. Based on this knowledge, then, methods for enhancing GaN-based LEDs' lighting efficiency and brightness can be developed and discovered. These high-efficiency and high-brightness GaN-based LEDs would soon find their widespread applications in outdoor display panels and automobile lamps.

The lighting efficiency of a GaN-based LED is mainly determined by the GaN-based LED's internal quantum efficiency and external quantum efficiency. The former relates to the probability of recombination of electrons and holes, thereby causing photons to be released, within the GaN-based LED's active layer. The more easily the electrons and holes are recombined, the more photons are released, and the higher the lighting efficiency of the GaN-based LED will be. The latter, on the other hand, relates to the probability of photons' successful escape from the GaN-based LED without being absorbed or trapped inside. The more photons escape from the GaN-based LED, the higher the external quantum efficiency is, and the higher the lighting efficiency of the GaN-based LED will be.

The GaN-based LED's external quantum efficiency would, therefore, be affected by its index of refraction. Generally, the index of refraction of GaN-based LEDs is 2.5, higher than that of the atmosphere (which is 1). As such, total internal reflection would happen and photons released from the active layer would be trapped inside the GaN-based LEDs, significantly reducing the external quantum efficiency.

SUMMARY OF THE INVENTION

Therefore, the present invention provides an epitaxial structure for the GaN-based LEDs so that the limitations and disadvantages in terms of lighting efficiency and external quantum efficiency from the prior arts can be obviated practically.

The greatest difference between the GaN-based LEDs according to the present invention and the prior arts lies in the addition of a thin layer on top of the traditional structure. The thin layer could be formed using silicon-nitride (SiN), or it could have a short-period superlattice structure either made of layers of SiN and undoped indium-gallium-nitride (InGaN), or made of layers of SiN and undoped aluminum-gallium-indium-nitride (AlGaInN), alternately stacked upon each other. Because of the use of SiN in the thin layer, the surfaces of the GaN-based LEDs would be micro-roughened, and the total internal reflection resulted from the GaN-based LEDs' higher index of refraction than the atmosphere could be avoided. The GaN-based LEDs according to the present invention therefore have superior external quantum efficiency and lighting efficiency.

The improvement in the GaN-based LEDs' lighting efficiency could be easily seen from FIG. 1. FIG. 1 is a characteristics graph showing, under different amount of injection current, the brightness measured from GaN-based LEDs according to the present invention and the prior arts. As shown in FIG. 1, the GaN-based LEDs with the aforementioned thin layer having a superlattice structure made of SiN and undoped $In_{0.2}Ga_{0.8}N$ apparently have a superior lighting efficiency than the GaN-based LEDs according to prior arts.

In addition, as the thin layer has a lower band gap than that of the traditional doped contact layer, the interposition of the thin layer between the contact layer below and the metallic electrode and transparent conductive layer above would have additional benefits, such as the resistivity between the thin layer and the electrode and the transparent conductive layer above is lower and, therefore, ohmic contact is easer to form.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The accompanied drawings are provided to illustrate the various embodiments of the present invention as described in this specification, so as to achieve better understanding of the major objectives of the present invention.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
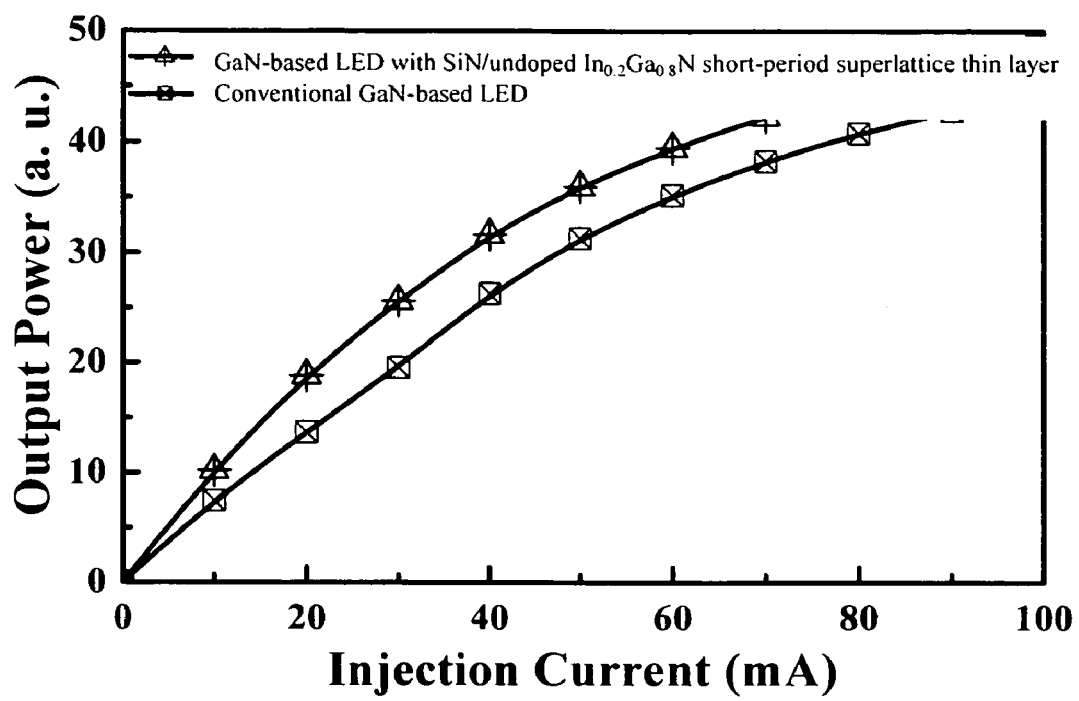
FIG. 1 is a characteristics graph showing, under different amount of injection current, the brightness measured from GaN-based LEDs according to the present invention and the prior arts.
Figure 2:
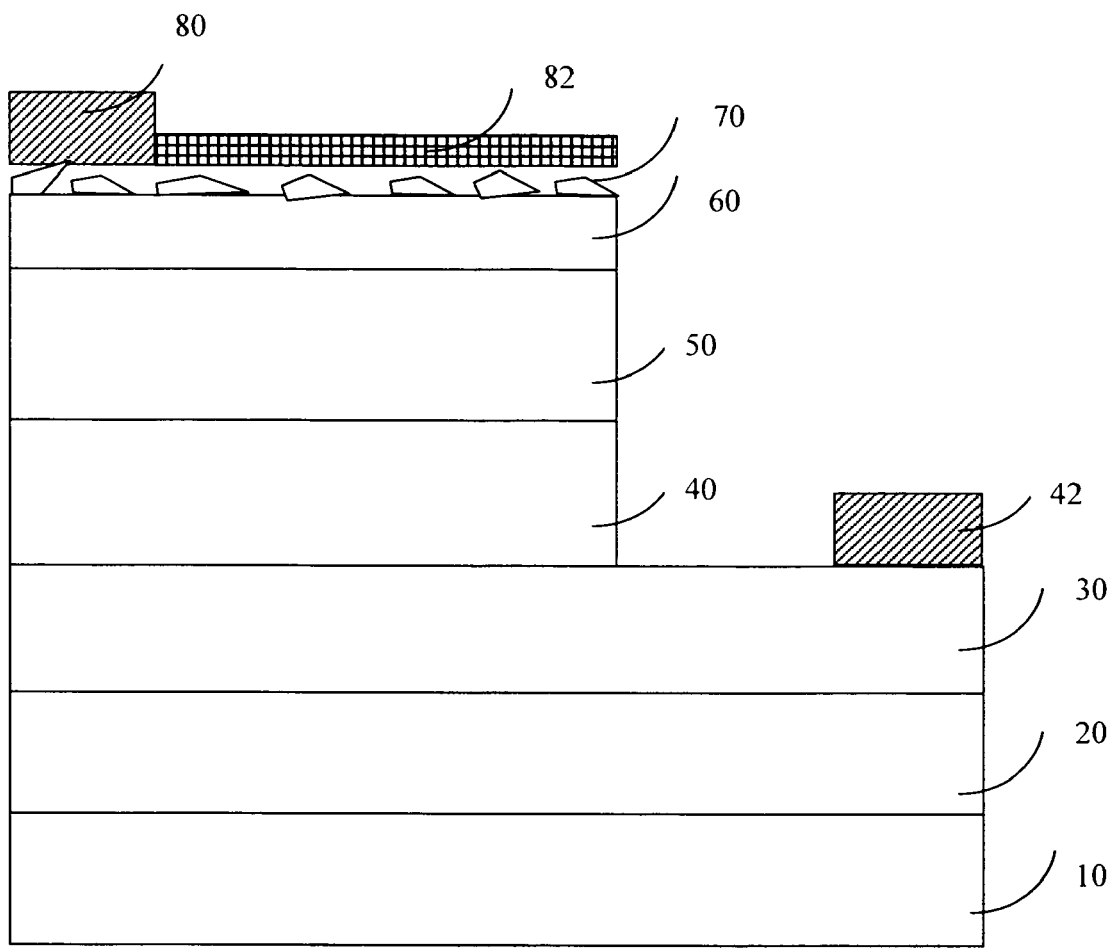
FIG. 2 is a schematic diagram showing a GaN-based LED device according to a first embodiment of the present invention.

FIG. 2 is a schematic diagram showing a GaN-based LED device according to a first embodiment of the present invention. As shown in FIG. 2, the GaN-based LED has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or MgAl$_2$O$_4$. Generally, the most common material used for the substrate 10 is sapphire or SiC. An optional buffer layer 20 made of a GaN-based material whose molecular formula could be expressed as Al$_a$Ga$_b$In$_{1-a-b}$N (0≦a,b<1, a+b≦1) having a specific composition is then formed on an upper side of the substrate 10. On top of the buffer layer 20, a first contact layer 30 made of a GaN-based material having a first conduction type (e.g., it could be p-typed or n-typed GaN) is formed on the buffer layer 20. On top of the first contact layer 30, an active layer 40 made of a GaN-based material such as indium-gallium-nitride (InGaN) is formed on top of the first contact layer 30.

On top of the active layer 40, an optional cladding layer 50 made of a GaN-based material having a second conduction type opposite to that of the first contact layer 30. In other words, for example, if the first contact layer 30 is made of an n-typed GaN-based material, then the cladding layer 50 is made of a p-typed GaN-based material. Then, on top of the cladding layer 50 or the active layer 40 (if there is no cladding layer 50), a second contact layer 60 made of a GaN-based material having the second conduction type opposite to that of the first contact layer 30 is formed. Again, on top of the second contact layer 60, a micro-roughened thin layer 70, which is the major characteristic to the present invention, is formed. In the present embodiment, the micro-roughened thin layer 70 is made of a group-IV nitride Si$_d$N$_e$ (0<d, e<1) having a specific composition. The micro-roughened thin layer 70 has a thickness between 2 Å and 50 Å and is formed at a growing temperature between 600° C. and 1100° C. The micro-roughened thin layer 70, thus formed, contains multiple randomly distributed micro-clusters of Si$_d$N$_e$ on the second contact layer 60. It is important to note that the multiple randomly distributed micro-clusters of the micro-roughened thin layer can reduce the total reflection of light inside the GaN-based LED structure and improve external quantum efficiency because of the randomness in the distribution of the micro-clusters. In other words, the micro-clusters are un-uniformly distributed as shown in FIG. 2.

Up to this point, the epitaxial structure of the present invention has been completed. To package the epitaxial structure into a LED device, the electrodes for the LED device have to be formed. Conventionally, the epitaxial structure is appropriately etched to expose a portion of the first contact layer 30 and, then, a first electrode 42 made of an appropriate metallic material is formed on top of the exposed first contact layer 30.

On the other hand, on top of the micro-roughened thin layer 70, an optional transparent conductive layer 82 could be formed. The transparent conductive layer 82 can be a metallic conductive layer or a transparent oxide layer. The metallic conductive layer is made of one of the materials including, but not limited to, Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, Ni/Pd/Au alloy, and other similar materials. The transparent oxide layer, on the other hand, is made of one of the materials including, but not limited to, ITO, CTO, ZnO:Al, ZnGa$_2$O$_4$, SnO$_2$:Sb, Ga$_2$O$_3$:Sn, AgInO$_2$:Sn, In$_2$O$_3$:Zn, CuAlO$_2$, LaCuOS, NiO, CuGaO$_2$, and SrCu$_2$O$_2$. A second electrode 80 is formed on top of the transparent conductive layer 82 or besides the transparent conductive layer 82 as shown in the accompanied drawings. The second electrode 80 is made of one of the materials including, but not limited to, Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, TiWN$_x$ (x≧0), WSi$_y$ (y≧0), and other similar metallic materials.

Figure 3:
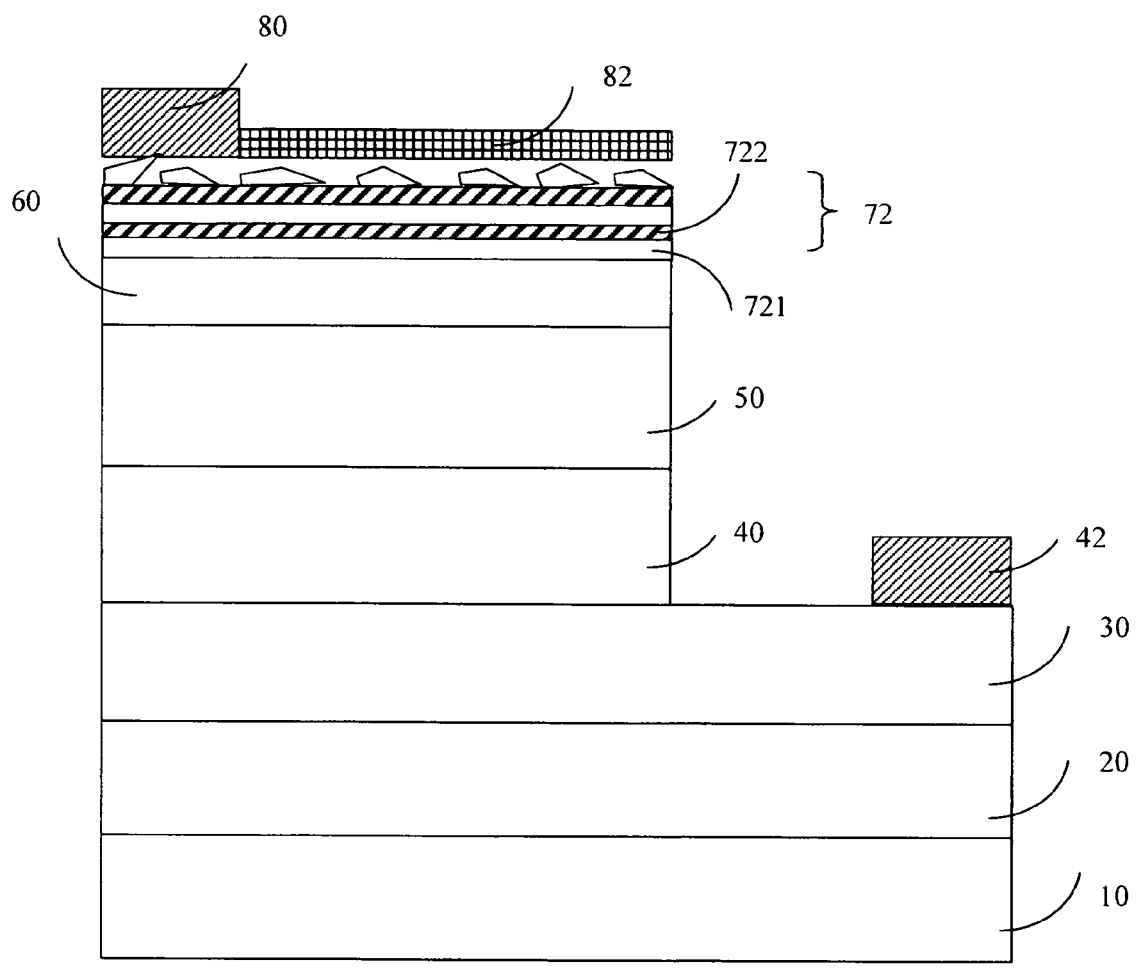
FIG. 3 is a schematic diagram showing a GaN-based LED device according to a second embodiment of the present invention.

FIG. 3 is a schematic diagram showing a GaN-based LED device according to a second embodiment of the present invention. As shown in FIG. 3, the present embodiment has an identical structure as in the previous embodiment. The only difference lies in the material and structure used for the micro-roughened thin layer. In the present embodiment, the micro-roughened thin layer 72 has a short-period superlattice structure formed by interleaving at least a SiN thin layer 721 and at least an InGaN thin layer 722. Each of the SiN thin layers 721 is made of Si$_f$N$_g$ (0<f, g<1) having a specific composition, and has a thickness between 2 Å and 20 Å, and is formed at a growing temperature between 600° C. and 1100° C. In addition, the Si$_f$N$_g$ composition (i.e., the parameters f, g of the foregoing molecular formula) of each SiN thin layer 721 is not necessarily identical. On the other hand, each of the InGaN thin layers 722 is made of undoped In$_h$Ga$_{1-h}$N (0<h≦1) having a specific composition, and has a thickness between 2 Å and 20 Å, and is formed at a growing temperature between 600° C. and 1100° C. Similarly, the In$_h$Ga$_{1-h}$N composition (i.e. the parameters h of the foregoing molecular formula) of each InGaN thin layer 722 is not required to be identical.

Within the superlattice structure of the micro-roughened thin layer 72, the bottommost layer (i.e., the one immediately above the second contact layer 60) could be a SiN thin layer 721. Then, on top of the bottommost SiN thin layer 721, an InGaN thin layer 722, another SiN thin layer 721, another InGaN thin layer 722, and so on, are sequentially and alternately stacked in this repetitive pattern. Alternatively, the bottommost layer could be an InGaN thin layer 722. Then, on top of the bottommost InGaN thin layer 722, a SiN thin layer 721, another InGaN thin layer 722, another SiN thin layer 721, and so on, are sequentially and alternately stacked in this repetitive pattern. The number of repetition is at least one (i.e., both the number of the SiN thin layers 721 and the number of the InGaN thin layers 722 are at least one). The overall thickness of the micro-roughened thin layer 72 should be no more than 200 Å.

Figure 4:
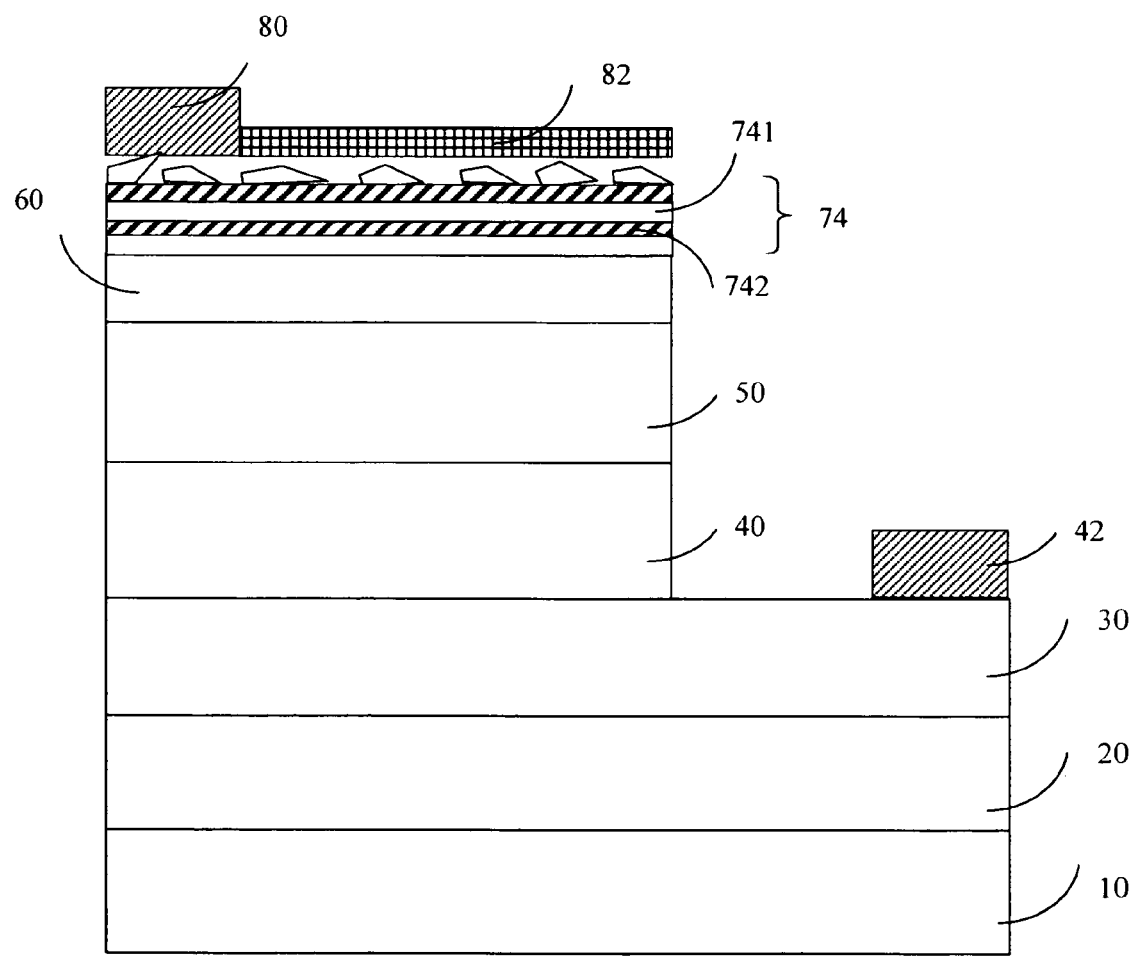
FIG. 4 is a schematic diagram showing a GaN-based LED device according to a third embodiment of the present invention.

FIG. 4 is a schematic diagram showing a GaN-based LED device according to a third embodiment of the present invention. As shown in FIG. 4, the present embodiment has an identical structure as in the previous embodiment. The only difference lies in the material and structure used for the micro-roughened thin layer. In the present embodiment, the micro-roughened thin layer 74 has a short-period superlattice structure formed by interleaving at least a SiN thin layer 741 and at least an AlInGaN thin layer 742. Each of the SiN thin layers 741 is made of Si$_i$N$_j$ (0<i, j<1) having a specific composition, and has a thickness between 2 Å and 20 Å, and is formed at a growing temperature between 600° C. and 1100° C. On the other hand, each of the AlInGaN thin layers 742 is made of undoped Al$_m$In$_n$Ga$_{1-m-n}$N (0<m, n<1, m+n<1) having a specific composition, and has a thickness between 2 Å and 20 Å, and is formed at a growing temperature between 600° C. and 1100° C. Similarly, the S$_i$N$_j$ and Al$_m$In$_n$Ga$_{1-m-n}$N composition of each SiN thin layers 741 and AlInGaN thins layers 742 are not required to be identical.

Within the micro-roughened layer 74, the bottommost layer (i.e., the one immediately above the second contact layer 60) could be a SiN thin layer 741. Then, on top of the bottommost SiN thin layer 741, an AlInGaN thin layer 742, another SiN thin layer 741, another AlInGaN thin layer 742, and so on, are sequentially and alternately stacked in this repetitive pattern. Alternatively, the bottommost layer could be an AlInGaN thin layer 742. Then, on top of the bottommost AlInGaN thin layer 742, a SiN thin layer 741, another AlInGaN thin layer 742, another SiN thin layer 741, and so on, are sequentially and alternately stacked in this repetitive pattern. The number of repetition is at least one (i.e., both the number of the SiN thin layers 741 and the number of the AlInGaN thin layers 742 are at least one). The overall thickness of the micro-roughened thin layer 74 should be no more than 200 Å.

In aforementioned preferred embodiments of the present invention, the development of the SiN material within the micro-roughened thin layer would cause the surfaces of the GaN-based LEDs to be micro-roughened. As such, the total internal reflection resulted from the GaN-based LEDs' higher index of refraction than the atmosphere could be avoided. The GaN-based LEDs according to the present invention therefore have superior external quantum efficiency and lighting efficiency.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based LED structure, comprising:
   a substrate;
   a first contact layer made of a GaN-based material having a first conduction type located on top of said substrate;
   an active layer made of a GaN-based material located on top of said first contact layer;
   a second contact layer made of a GaN-based material having a second conduction type opposite to said first conduction type located on top of said active layer; and
   a micro-roughened thin layer made of at least a SiN-based material located on top of said second contact layer;
   wherein said micro-roughed thin layer contains multiple un-uniformly distributed micro-clusters of said SiN-based material for improving external quantum efficiency by reducing total internal reflection of light inside said GaN-based LED structure.

2. The GaN-based LED structure as claimed in claim 1, wherein said active layer is made of InGaN.

3. The GaN-based LED structure as claimed in claim 1, further comprising a buffer layer made of a GaN-based material interposed between said substrate and said first contact layer.

4. The GaN-based LED structure as claimed in claim 3, wherein said buffer layer is made of $Al_aGa_bIn_{1-a-b}N$ ($0 \leq a, b<1, a+b \leq 1$) having a specific composition.

5. The GaN-based LED structure as claimed in claim 1, further comprising a cladding layer made of a GaN-based material having said second conduction type interposed between said active layer and said second contact layer.

6. The GaN-based LED structure as claimed in claim 1, wherein said micro-roughened thin layer is made of $Si_dN_e$ ($0<d, e<1$) having a specific composition.

7. The GaN-based LED structure as claimed in claim 6, wherein said micro-roughened thin layer has a thickness between 2 Å and 50 Å.

8. The GaN-based LED structure as claimed in claim 1, wherein said micro-roughened thin layer has a short-period superlattice structure having at least an $Si_fN_g$ ($0<f, g<1$) thin layer and at least an undoped $In_hGa_{1-h}N$ ($0<h \leq 1$) thin layer alternately stacked upon each other.

9. The GaN-based LED structure as claimed in claim 8, wherein said micro-roughened thin layer has a thickness no more than 200 Å, and each of said $Si_fN_g$ thin layers and $In_hGa_{1-h}N$ thin layers has a thickness between 2 Å and 20 Å.

10. The GaN-based LED structure as claimed in claim 1, wherein said micro-roughened thin layer has a short-period superlattice structure having at least an $Si_iN_j$ ($0<i, j<1$) thin layer and at least an undoped $Al_mIn_nGa_{1-m-n}N$ ($0<m, n<1, m+n<1$) thin layer alternately stacked upon each other.

11. The GaN-based LED structure as claimed in claim 10, wherein said micro-roughened thin layer has a thickness no more than 200 Å, and each of said $Si_iN_j$ thin layers and $Al_mIn_nGa_{1-m-n}N$ thin layers has a thickness between 2 Å and 20 Å.

12. A GaN-based LED device, comprising:
   a substrate;
   a buffer layer made of $Al_aGa_bIn_{1-a-b}N$ ($0 \leq a,b<1, a+b \leq 1$) having a specific composition located on top of an upper side of said substrate;
   a first contact layer made of a GaN-based material having a first conduction type located on top of said buffer layer;
   an active layer made of InGaN located on top of a part of said first contact layer's upper surface;
   a first electrode located on top of another part of said first contact layer's upper surface not covered by said active layer;
   a second contact layer made of a GaN-based material having a second conduction type opposite to said first conduction type located on top of said active layer;
   a micro-roughened thin layer made of at least a SiN-based material located on top of said second contact layer;
   a transparent conductive layer that is one of a metallic conductive layer and a transparent oxide layer located on top of said micro-roughened thin layer's upper surface; and
   a second electrode located on top of said transparent conductive layer or on top of another part of said micro-roughened thin layer's upper surface not covered by said transparent conductive layer;
   wherein said micro-roughed thin layer contains multiple un-uniformly distributed micro-clusters of said SiN-based material for improving external quantum efficiency by reducing total internal reflection of light inside said GaN-based LED structure.

13. The GaN-based LED device as claimed in claim 12, wherein said metallic conductive layer is made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy.

14. The high-brightness GaN-based LED device as claimed in claim 12, wherein said transparent oxide layer is made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

15. The high-brightness GaN-based LED device as claimed in claim 12, wherein said second electrode is made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), and $WSi_y$ ($y \geq 0$).

16. The high-brightness GaN-based LED device as claimed in claim 12, further comprising a cladding layer made of a GaN-based material having said second conduction type interposed between said active layer and said second contact layer.

17. The GaN-based LED device as claimed in claim 12, wherein said micro-roughened thin layer is made of $Si_dN_e$ ($0<d, e<1$) having a specific composition.

18. The GaN-based LED device as claimed in claim 12, wherein said micro-roughened thin layer has a thickness between 2 Å and 50 Å.

19. The GaN-based LED device as claimed in claim 12, wherein said micro-roughened thin layer has a short-period superlattice structure having at least an $Si_fN_g$ ($0<f, g<1$) thin layer and at least an undoped $In_hGa_{1-h}N$ ($0<h\leq1$) thin layer alternately stacked upon each other.

20. The GaN-based LED device as claimed in claim 19, wherein said micro-roughened thin layer has a thickness no more than 200 Å, and each of said $Si_fN_g$ thin layers and $In_hGa_{1-h}N$ thin layers has a thickness between 2 Å and 20 Å.

21. The GaN-based LED device as claimed in claim 12, wherein said micro-roughened thin layer has a short-period superlattice structure having at least an $Si_iN_j$ ($0<i, j<1$) thin layer and at least an undoped $Al_mIn_nGa_{1-m-n}N$ ($0<m, n<1$, $m+n<1$) thin layer alternately stacked upon each other.

22. The GaN-based LED device as claimed in claim 21, wherein said micro-roughened thin layer has a thickness no more than 200 Å, and each of said $Si_iN_j$ thin layers and $Al_mIn_nGa_{1-m-n}N$ thin layers has a thickness between 2 Å and 20 Å.

23. The GaN-based LED structure as claimed in claim 1, wherein said micro-roughened thin layer has a thickness between 10 Å and 50 Å.

24. The GaN-based LED device as claimed in claim 12, wherein said micro-roughened thin layer has a thickness between 10 Å and 200 Å.

* * * * *